United States Patent [19]

Ohba et al.

[11] 4,155,094

[45] May 15, 1979

[54] SOLID-STATE IMAGING DEVICE

[75] Inventors: Shinya Ohba, Kokubunji; Kyotake Uchiumi, Tokyo, both of Japan

[73] Assignee: Hitachi, Ltd., Japan

[21] Appl. No.: 837,709

[22] Filed: Sep. 29, 1977

[30] Foreign Application Priority Data

Oct. 6, 1976 [JP] Japan ................................ 51/119347

[51] Int. Cl.² ..................... H01L 27/14; H01L 27/78
[52] U.S. Cl. ....................................... 357/30; 357/24; 357/23
[58] Field of Search ............................. 357/30, 24, 23

[56] References Cited

U.S. PATENT DOCUMENTS 3,883,437  5/1975  Numma et al. ...................... 250/332

FOREIGN PATENT DOCUMENTS 7506795  12/1976  Netherlands ............................... 357/24

Primary Examiner—Martin H. Edlow
Attorney, Agent, or Firm—Craig & Antonelli

[57]  ABSTRACT

In a semiconductor photoelectric device comprising a plurality of photodiodes, MOS transistor switches and signal output means which are provided on a semiconductor substrate, a solid-state imaging device characterized in that said each photodiode is constructed of a PN-junction diode and an MIS or MOS diode. Means are provided for permitting incident light to fall on only the PN-junction diode.

9 Claims, 12 Drawing Figures

SOLID-STATE IMAGING DEVICE

BACKGROUND OF THE INVENTION

(1) Field of the Invention

This invention relates to a solid-state imaging device which has a plurality of photoelectric elements packed in a semiconductor surface region. More particularly, it relates to a solid-state imaging device which has photoelectric elements for reading out from photodiodes photo information stored therein.

(2) Description of the Prior Art

FIG. 1A shows a prior-art solid-state imaging device. In this figure, numeral 11 designates a gate line, numeral 12 an output line, numeral 13 a switching metal-oxide-semiconductor (MOS) transistor, and numeral 14 a photo PN-junction diode. The sectional structure of the solid-state imaging device corresponding to one picture element is illustrated in FIG. 1B. In this figure, numeral 15 indicates a silicon dioxide ($SiO_2$) film, and numeral 16 a p-conductivity type silicon substrate. The gate electrode 11 is made of, for example, polycrystalline silicon. An n+-conductivity type diffused layer forms the signal output line 12. Another diffusion layer of the n+-conductivity type forms the photosensitive region of the photodiode 14. Shown at 17 is a depletion layer which spreads in the substrate 16.

In this system, photo-information is stored in the junction capacitance between the p-type substrate 16 and the n+-type diffused layer 14. As discussed below, the storage capacitance is roughly one order smaller than in a surface MOS diode to be described later. Letting $V_H$ denote the pulse amplitude of an operating voltage, $V_T$ the threshold voltage of the MOS transistor switch, $\epsilon_S$ the dielectric constant of silicon, q the electronic charge, $V_{bi}$ the built-in potential, $N_A$ the impurity concentration of the substrate, and $N_D$ the impurity concentration of the n+-type diffused layer, the thickness $X_D$ of the depletion layer 17 is represented by the following equation:

$$X_D = \sqrt{\frac{2\epsilon_S}{q} \cdot \frac{N_D + N_A}{N_D \cdot N_A} \cdot (V_H - V_T + V_{bi})} \quad (1)$$

By way of example, let it be supposed that $V_H (\sim 5\ V) - V_T (\sim 0.7\ V) + V_{bi} (\sim 0.6\ V) = 5\ V$, $N_A = 1 \times 10^{15}$ cm$^{-3}$ and $N_D = 1 \times 10^{19}$ cm$^{-3}$. Then, the thickness of the depletion layer becomes:

$$X_D \approx 2.1\ \mu m \quad (2)$$

The capacitance $C_D$ per unit area becomes:
$$C_D = \epsilon_S / X_D \approx 0.5 \times 10^{-8}\ F/cm^2 \quad (3)$$

On the other hand, in another prior art device shown in FIGS. 2A and 2B wherein the MOS structure (surface MOS diode) is employed for the capacitance, when the thickness $T_{OX}$ of a silicon dioxide film 15 under an electrode 19 is assumed to be 1,000 Å and $\epsilon_{OX}$ denotes the dielectric constant of silicon dioxide, the capacitance $C_{OX}$ per unit area becomes:

$$C_{OX} = \epsilon_{OX} / T_{OX} \approx 3.5 \times 10^{-8}\ F/cm^2 \quad (4)$$

In the case of FIGS. 1A and 1B, the capacitance per unit area is as small as 1/7 of that in the case of FIGS. 2A and 2B, and hence, the packing density is not enhanced.

The prior art device in FIGS. 2A and 2B consists in an expedient wherein an inversion layer in a substrate surface based on the MOS structure is utilized instead of that based on the PN-junction diode 14 in FIGS. 1A and 1B. In this case, a high electric field exists in the Si surface, so that most of hole-electron pairs generated in Si contribute to optical information. Since, however, the greater part of light illuminating the device is absorbed by the electrode 19, the total photosensitivity and the sensitivity in the blue region are conspicuously lower than those of the prior-art device in FIGS. 1A and 1B. In order to enhance the photosensitivity, the thickness of the electrode 19 may be lessened. With the present technology, however, it is very difficult to make the thickness of the electrode 19 less than 0.3 μm without raising the resistance.

SUMMARY OF THE INVENTION

This invention provides a solid-state imaging device which is free from the disadvantages of the prior-art solid-state imaging devices described above.

An object of this invention is to provide a solid-state imaging device in which the quantum efficiency (i.e., the sensitivity) is high, the dark current is little and the storage capacitance is large.

In the solid-state imaging device of this invention, a photosensitive portion is constructed of a PN-junction diode which has a high sensitivity, while a portion for storing signal charges is constructed of a MOS structure (a surface MOS diode) which exhibits a low dark current and a high storage capacitance.

More specifically, the construction of this invention concerns a semiconductor photoelectric device comprising a plurality of photodiodes, MOS transistor switches and means for detecting signal charges, all being provided on a semiconductor substrate, and consists in a solid-state imaging device characterized in that the photodiode is constructed of a PN-junction diode and a metal-insulator-semiconductor (MIS) diode or a metal-oxide-semiconductor (MOS) diode. Means are provided for permitting incident light to illuminate only the PN-junction diode.

The features in performance of the solid-state imaging device of this invention are a low dark current, a low non-uniformity and a high sensitivity owing to the sensing of light with the PN-junction diode and the storage of signal charges with the MIS structure.

DESCRIPTION OF THE PREFERRED EMBODIMENTS

Figure 3:
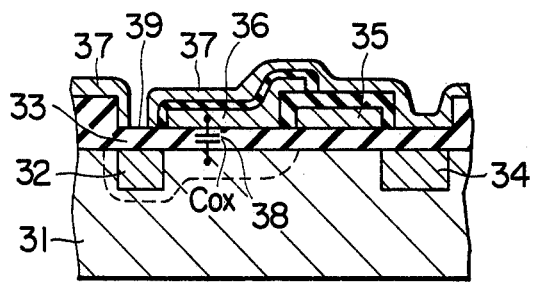
FIG. 3 is a view showing the sectional structure of a solid-state imaging device of an embodiment of this invention as corresponds to one picture element.

FIG. 3 is a sectional view showing an embodiment of this invention. In the figure, numeral 31 designates a p-type silicon substrate. Numeral 32 designates an n-type impurity doped layer which constitutes a photosensitive region and which is formed by the thermal diffusion, ion implantation or the like. An insulating film 33 is made of silicon dioxide or the like. Shown at 34 is an n-type impurity doped layer which serves as an output line. A gate electrode 35 for an MOS transistor switch is formed of polycrystalline silicon or the like. A gate electrode 36 for a storage portion is also formed of polycrystalline silicon or the like. Numeral 37 indicates a photo-shield plate which is made of aluminum or the like.

Light illuminates only the n-type layer 32 through a hole 39 provided in the photo-shield plate 37. Electrons generated therein are held underneath the storage-gate electrode 36 and in the n-type layer 32. Accordingly, the spectral sensitivity and the photo sensitivity are determined by the n-type layer 32, and the maximum quantity of charges which can be held is determined mostly by a large capacitance $C_{OX}38$. Consequently, a solid-state imaging device which is higher in the sensitivities and the density of integration than the prior-art devices can be produced.

In the case of the solid-state imaging device shown in FIG. 3, under the same conditions as those for evaluating $C_D$ and $C_{OX}$ in the foregoing equations (3) and (4), i.e., when the impurity concentration of the p-type Si substrate is $1 \times 10^{15}$ cm$^{-3}$, the thickness of the oxide film is 1,000 Å and the electron concentration of the n-type layer is $1 \times 10^{19}$ cm$^{-3}$, the capacitance $C_S$ per unit area becomes:

$$C_S = C_D + C_{OX} = 4 \times 10^{-8} F/cm^2 \qquad (5)$$

Figure 1A:
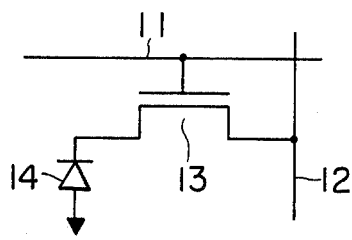
FIG. 1A is a schematic diagram of a prior-art solid-state imaging device which employs a PN-junction diode as a photosensor.
Figure 1B:
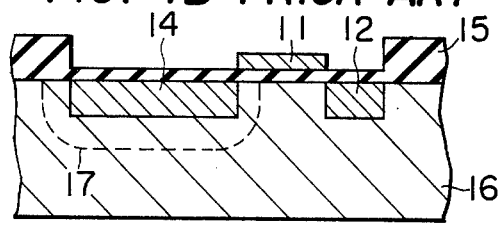
FIG. 1B is a view showing the sectional structure of the solid-state imaging device in FIG. 1A as corresponds to one picture element.
Figure 2A:
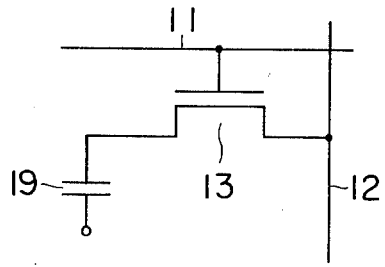
FIG. 2A is a schematic diagram of another prior-art solid-state imaging device which employs a surface MOS diode as a photosensor.
Figure 2B:
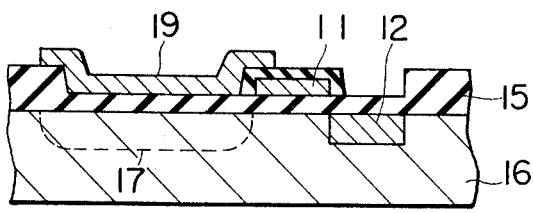
FIG. 2B is a view showing the sectional structure of the solid-state imaging device in FIG. 2A as corresponds to one picture element.
Figure 9:
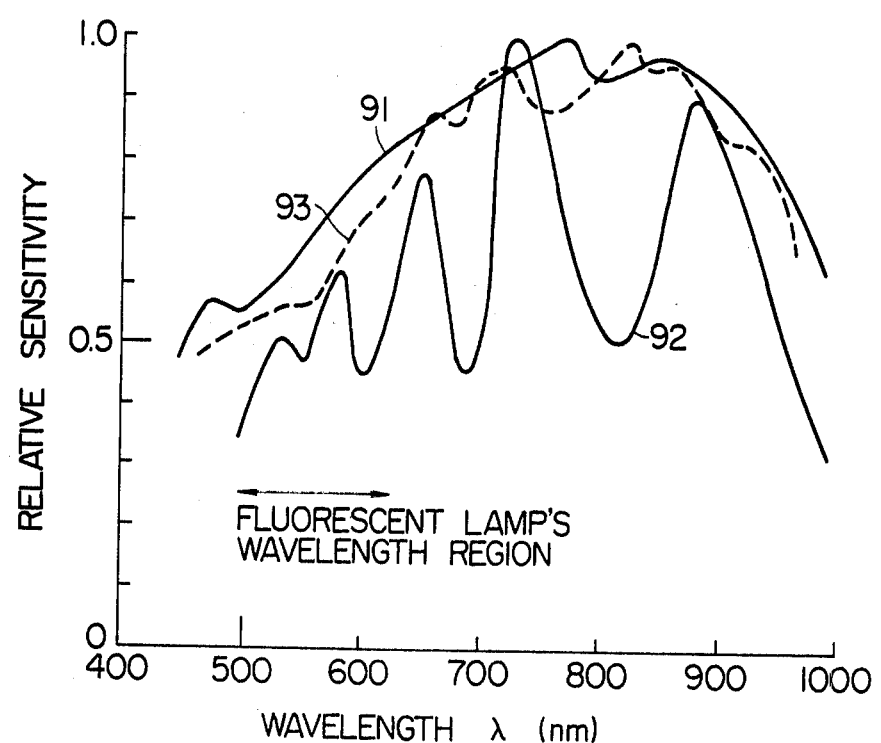
FIG. 9 shows the photosensitivity of the device of the present invention in comparison with the prior art devices shown in FIGS. 1B and 2B.

This storage capacitance is sufficiently large. Regarding the dark current, a value of 3 nA/cm$^2$ is exhibited in the sensing and storage system employing the PN-junction diode as illustrated in FIGS. 1A and 1B (PN-junction diode system), while a value of 5 nA/cm$^2$ is exhibited in the sensing and storage system employing the MOS structure (the surface MOS diode) as illustrated in FIGS. 2A and 2B (surface MOS diode system). On the other hand, in the device employing the structure of FIG. 3 according to this invention, the dark current is 2–5 nA/cm$^2$ and is intermediate between both the aforecited systems. Regarding the photosensitivity, as apparent from FIG. 9, the photosensitivity 91 of the device employing the structure of FIG. 3 according to this invention is better than that shown by curve 92 in the surface MOS diode system, and it is substantially equal to or better than that shown by curve 93 in the PN-junction diode system.

As appreciated from the above description, by receiving light with the PN-junction diode and storing signal charges with the surface MOS diode in accordance with this invention, there can be realized a solid-state imaging device of large storage capacitance, low dark current and good sensitivity.

Figure 4:
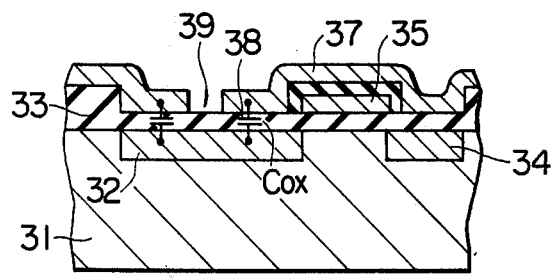
FIG. 4 is a view showing the sectional structure of a solid-state imaging device of another embodiment of this invention as corresponds to one picture element.

FIG. 4 shows another embodiment of this invention. In the figure, a part 37 serves as a photo-shield plate and simultaneously as a storage gate electrode. Also in this case, light is permitted to enter only through a hole 39, and charges are stored in an oxide film capacitance $C_{OX}38$. Herein, an n-type layer 32 extends under a storage portion. This, however, brings about no hindrance to the principle of this invention. Such extension is rather convenient because the photosensitive region 32 can be fabricated by the same process step as for an n-type layer 34 serving as an output line.

The advantages of this invention become clear when the n-type layer 32, the storage gate electrode 36 (or 37), and the photo-shield plate 37 including the hole 39 are combined. For example, in the case where, in the embodiment of FIG. 4, the storage gate electrode 37 covers the whole surface without providing the hole 39, the resultant device scarcely varies in performance from the prior art shown in FIGS. 2A and 2B and it is inferior in photosensitivity to the embodiment of FIG. 4. Thus the object of this invention would not be accomplished.

Although the device of the embodiment of this invention as corresponds to only one picture element is shown in FIG. 3 or FIG. 4, such devices may be arrayed in one dimension into a linear sensor or in two dimensions into an areal sensor in order to obtain an actual solid-state imaging device.

Figure 5:
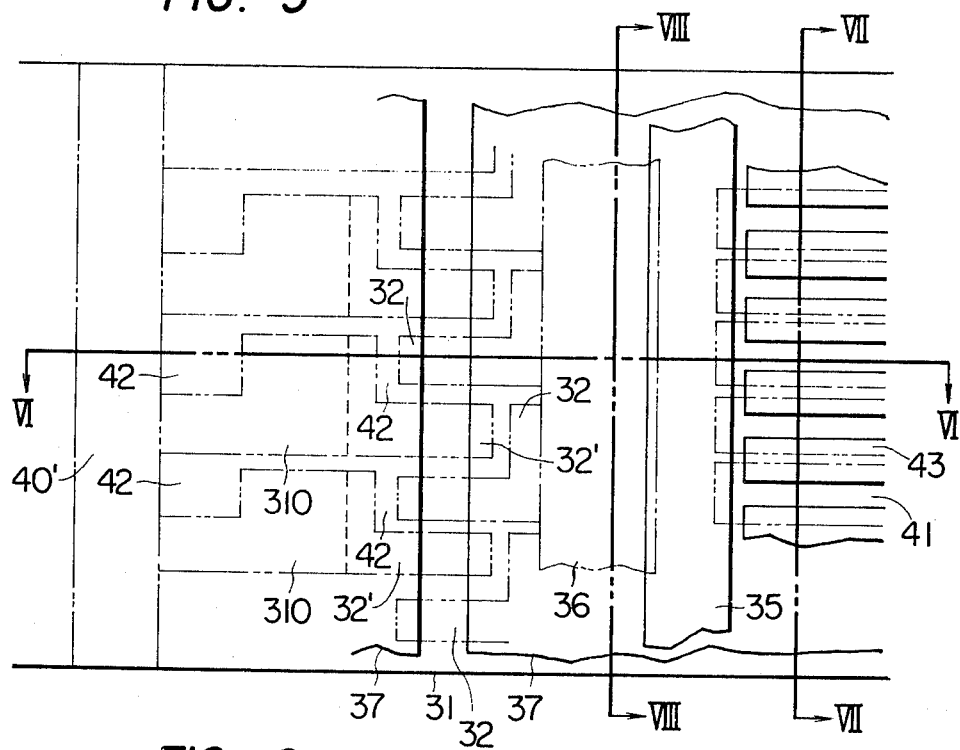
FIG. 5 is a plan view showing an electrode pattern and an impurity-doped layer pattern in an embodiment wherein a linear sensor is constructed by the use of the solid-state imaging device of this invention.
Figure 6:
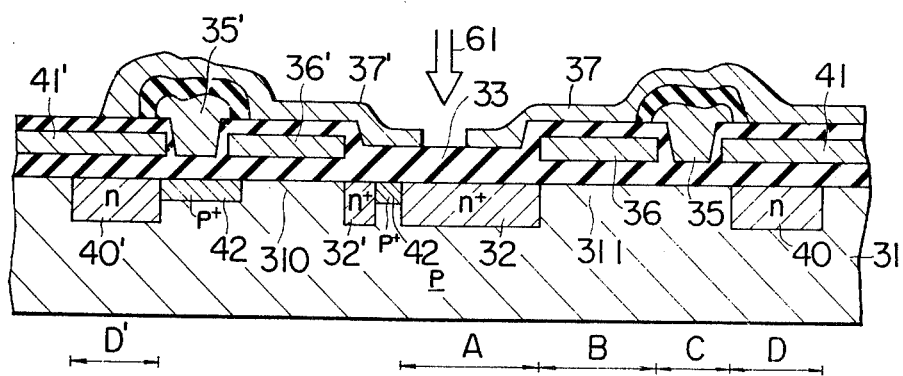
FIG. 6 shows a sectional view taken along line VI—VI in FIG. 5.
Figure 7A:
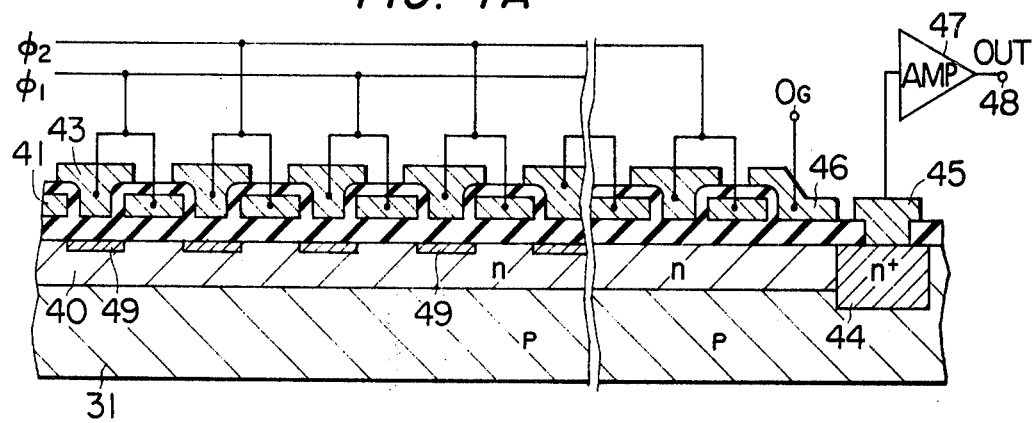
FIG. 7A shows a sectional view taken along line VII—VII in FIG. 5.
Figure 7B:
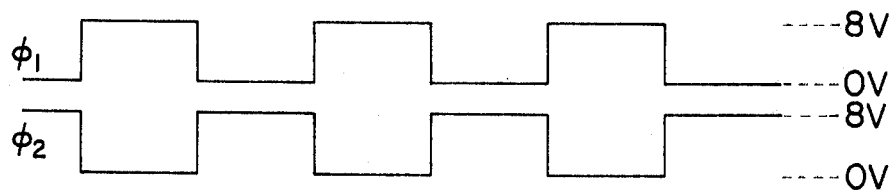
FIG. 7B is a diagram for explaining two-phase driving pulses $\phi_1$ and $\phi_2$ which are impressed on transfer electrodes of a BCD.
Figure 8:
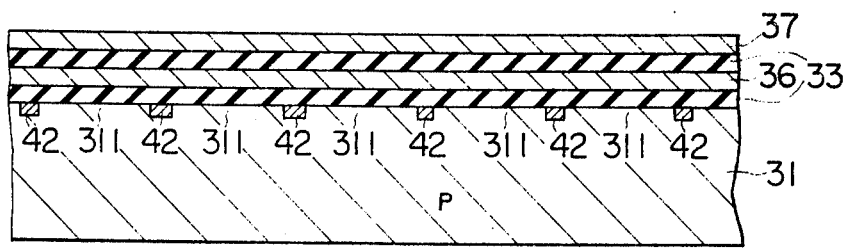
FIG. 8 shows a sectional view taken along line VIII—VIII of FIG. 5.

FIGS. 5, 6, 7A and 7B, and 8 illustrate an embodiment wherein a linear sensor is constructed by employing the solid-state imaging device of this invention. FIG. 5 is a plan view showing an electrode pattern and a pattern of impurity-doped layers (formed by ion implantation, thermal diffusion, or the like). The electrode pattern in the left half portion and the impurity-doped layer pattern under electrodes in the right half portion are omitted from the figure. FIGS. 6, 7A and 8 are sectional views taken along lines VI—VI, VII—VII and VIII—VIII in FIG. 5, respectively. Referring to the figures, numeral 61 indicates incident light, and numerals 35 and 35' represent switching gate electrodes of MOS transistor switches. Numerals 32 and 32' denote n-type layers (impurity concentration: $1 \times 10^{16} - 1 \times 10^{20}$ cm$^{-3}$) of photosensitive regions, which constitute photodiodes by PN-junctions with a p-type silicon substrate 31 (impurity concentration: around $1 \times 10^{15}$ cm$^{-3}$). A p-type layer 42 (impurity concentration: $1 \times 10^{16} - 1 \times 10^{17}$ cm$^{-3}$) formed by ion implantation, diffusion or the like serves as a channel stopper for isolating the adjacent picture elements. Photo-shield plates 37 and 37' are made of aluminum. Shown at 36 and 36' are storage gate electrodes of storing MOS structure portions, which are made of polycrystalline silicon and which are fixed to a predetermined D.C. voltage (for example, 8 V). Letter A designates a photosensitive portion, letter B a storage capacitance portion, letter C an MOS transistor switch portion, and letter D a charge transfer element portion.

In operation, the light received by the n-type layers 32, 32' is stored in substrate surface regions 310, 311 underneath the gate electrodes 36, 36' of the MOS structure. The information is shifted to the charge transfer elements D, D' by impressing gate pulse voltages (having an amplitude of, e.g., 8 V) on the switching gate electrodes 35, 35' of the MOS transistor switch portions, whereupon they are read out. The charge transfer device is an analog shift register which shifts signals along a plurality of electrodes 41, 43 provided on the silicon surface. Examples of such devices are the "Bucket Brigade Device: BBD" (IEEE Journal of Solid-State Circuit, SC-4 (1969), p. 131, F. L. J. Sangster), the "Charge Coupled Device: CCD" (Bell System Technical Journal, April 1970, p. 74), and the "Bulk Charge-transfer Device: BCD" (Proceedings of the 6th Conference on Solid State Device, 1974, p. 173—, M. Kubo), etc.

Numerals 40 and 40' in FIGS. 5 and 6 designate n-conductivity type layers (impurity concentration: $1 \times 10^{16} - 3 \times 10^{16}$ cm$^{-3}$) which correspond to the channels of the BCD's and which are formed by ion implantation, thermal diffusion or the like. The optical information is shifted to output ends along these n-type layers. In the case of the linear sensor shown in FIG. 5, the optical information is shifted alternately to the two right and left BCD's indicated at D and D'.

FIG. 7A shows the sectional structure of the BCD. In the figure, numerals 41 and 43 designate the transfer electrodes made of polycrystalline silicon. The electrodes 41 and 43 are divided into two electrode series in such a manner that the adjacent ones are conductively connected into one set by known means and that all of the second sets are conductively connected by known means. Driving pulses $\phi_1$ and $\phi_2$ shown in FIG. 7B are impressed on the two electrode series. In FIG. 7A, numeral 49 represents a layer in which boron ions (B+) of around $3 \times 10^{11}$ to $7 \times 10^{11}$ cm$^{-2}$ are implanted in order to form a potential barrier. Numeral 44 indicates an n+-type layer (impurity concentration: $1 \times 10^{16}$ to $1 \times 10^{20}$ cm$^{-3}$) for detecting an output potential. Shown at 46 is an output gate electrode which is made of polycrystalline silicon and on which a D.C. voltage (for example, 6 V) is impressed as a bias. Further, numeral 45 designates an output electrode made of aluminum or the like, numeral 47 an amplifier, and numeral 48 a signal output terminal. The amplifier 47 may be formed either as an integrated circuit on the identical semiconductor substrate or as an integrated circuit on a separate substrate.

The sectional view of FIG. 8 taken along line VIII—VIII in FIG. 5 illustrates that the silicon substrate surface regions 311 of the MOS structure portions in the storage capacitance portions of the respective picture elements are isolated by the channel stoppers (p+-conductivity type layers provided by the implantation of B+) 42.

In this embodiment, the photo-characteristics are determined by the n-type layers 32 though the method for detecting signals is different from that in the devices of FIG. 3 and FIG. 4. It is accordingly understood that the embodiment is also based on the principle of this invention.

In this embodiment, the n-type layer 39 of the BCD transfer portion has an impurity concentration of around $3 \times 10^{16} - 1 \times 10^{16}$ cm$^{-3}$, and it can be made common to the n-type layer of the photosensitive portion. It is accordingly possible to fabricate the n-type layer 32 of the photosensitive portion and the channel n-type layer 39 of the BCD by the same step of manufacture.

Table 1 below indicates the comparisons among the performances of a linear sensor employing the solid-state imaging device of the structure of this invention, a linear sensor employing the PN-junction diode system, and a linear sensor employing the MOS structure (surface MOS diode) system. From the table, it is clear that the improvement in performance brought about by the invention is excellent.

TABLE 1

| Sample Nos.<br>Items | 1<br>(this invention) | 2 | 3 |
|---|---|---|---|
| Light receiving portion | PN-junction diode | MOS structure | PN-junction diode |
| Storage portion | MOS structure | | |
| Transfer portion | BCD | BCD | BCD |
| Saturating exposure | <1.5 lux.sec | 2.8 lux.sec | 4.0 lux.sec |
| Dark current component (50° C., 10 msec) | 1-2% | 5-7% | 1-2% |
| Non-uniformity | ±5% | ±10% | ±10% |

In Table 1 the following notes are to be observed in relation to certain terms:

(1) Saturating exposure:

Represented in (lux.sec) by the product between an intensity of illumination and a storage time at a point where the output is saturated when the light illumination is intensified under the storage time previously set. A smaller value of the saturating exposure is better in order to simplify a light source.

(2) Dark current component or dark signal:

The percentage by which a leak current is added to a photo-signal. A smaller value is more favorable.

(3) Non-uniformity:

Represented in % by the dispersion of signal outputs in the vicinity of 50% of a saturation output voltage, the dispersion being with respect to the saturation voltage. This item concerns the stability of the device.

It is to be understood that the above-identified arrangements are simply illustrative of the application of the principles of the invention. Numerous other arrangements may be readily devised by those skilled in the art which embody the principles of the invention and fall within its spirit and scope.

What is claimed is:

1. A solid-state imaging device comprising:
   a semiconductor substrate of a first conductivity type having a major surface portion,
   a photoelectric element provided in said major surface portion, and including a PN-junction diode constituting a photosensitive portion and a metal-insulator semi-conductor capacitor constituting a signal charge storing portion,
   a signal charge output portion provided in said major surface portion, and constructed of a first region of a second conductivity type opposite to said first conductivity type,
   a metal-insulator semiconductor field effect transistor switch having a first portion comprising the signal charge storing portion, a second portion comprising the charge output portion, and a first gate electrode provided through a first gate insulating film on the substrate major surface lying between said signal charge output portion and said signal charge storing portion, said transistor switch portion operating by control of the first gate electrode to enter signal charges from said signal charge storing portion into said signal charge output portion, and a photo-shield layer having a window and covering said transistor switch including said charge storage portion so as to permit incident light to illuminate only said PN-junction diode in said photoelectric element.

2. A solid-state imaging device according to claim 1, wherein said photoelectric element includes:
   a second region of said second conductivity type constituting the PN-junction diode, and
   the metal-insulator semiconductor capacitance is composed of the major surface portion adjoining said second region, a second gate insulating film provided so as to cover said major surface portion, and a second gate electrode provided on said second gate insulating film.

3. A solid-state imaging device according to claim 2, wherein said second gate insulating film is provided on a part of said second region of said PN-junction diode, and said second gate electrode is provided through said second gate insulating film on said part of said second region.

4. A solid-state imaging device according to claim 3, wherein said second gate electrode serves also as said photo-shield layer.

5. A solid-state imaging device according to claim 1, further comprising a charge transfer device which is provided in said major surface portion and which receives the signal charges from said transistor switch portion and transfers them to said signal charge output portion.

6. A solid-state imaging device according to claim 1, wherein said semiconductor substrate is made of silicon.

7. A solid-state imaging device comprising a semiconductor body of a first conductivity type having a major surface portion and a plurality of photoelectric elements disposed in said major surface portion of the body, each said photoelectric element being comprised of:
   (a) a PN-junction diode having a region of a second conductivity type opposite to said first conductivity type, and which constitutes a photosensitive region,
   (b) a metal-insulator-semiconductor capacitor having a first gate insulating film provided so as to cover a a storage region adjacent to said region of a second conductivity type, and a first gate electrode provided on said first gate insulating film, and which constitutes a charge storage region,
   (c) a switching field-effect transistor having a first region comprising said charge storage region, a second gate insulating film provided so as to cover a region adjacent to said storage region, a second gate electrode provided on said second gate insulating film, and a region for outputting signal charges being adjacent to said region covered with said second gate electrode and functioning as the field-effect transistor together with said storage region and said switching gate electrode, and
   (d) an opaque film which is provided so as to cover said switching field-effect transistor including said charge storage region, and which has a window permitting incident light to only fall on said PN-junction diode.

8. A solid-state imaging device comprising a semiconductor body of a first conductivity type having a major surface portion and a plurality of photoelectric elements disposed in said major surface portion of the body, each said photoelectric element being comprised of:
   (a) a PN-junction diode having a region of a second conductivity type opposite to said first conductivity type, and which constitutes a photosensitive region,
   (b) a metal-insulator-semiconductor capacitor having a first gate insulating film provided so as to cover a storage region adjacent to said region of a second conductivity type and a first gate electrode provided on said first gate insulating film, and which constitutes a charge storage region,
   (c) a signal-charge transfer region having a part of said major surface portion which constitutes a transferring path, an insulating film provided so as to cover said part of said major surface portion, a series of transferring electrodes disposed on said insulating film, and a region for outputting signal charges provided so as to be adjacent to the electrodes,
   (d) a switching field-effect transistor having a first region comprising said storage region, a second gate insulating film provided so as to cover a region adjacent to said storage region, and a second gate electrode provided on said second gate insulating film and functioning as the field-effect transistor together with said storage region and said part of said major surface portion, and
   (e) an opaque film which is provided so as to cover said signal-charge transferring region, and said switching field-effect transistor including said charge storage region, and which has a window permitting incident light to only fall on said PN-junction diode.

9. A solid-state imaging device according to claim 8, wherein said part of said major surface portion has said second conductivity type.

* * * * *